United States Patent
Steinhoff et al.

(10) Patent No.: US 9,298,110 B2
(45) Date of Patent: Mar. 29, 2016

(54) RADIATION SOURCE APPARATUS, LITHOGRAPHIC APPARATUS, METHOD OF GENERATING AND DELIVERING RADIATION AND METHOD FOR MANUFACTURING A DEVICE

(75) Inventors: Jens Arno Steinhoff, Straelen (DE); Vadim Yevgenyevich Banine, Deurne (NL); Richard Joseph Bruls, Eindhoven (NL); Erik Roelof Loopstra, Eindhoven (NL); Hendrik Antony Johannes Neerhof, Eindhoven (NL); Adrianus Johannes Maria Van Dijk, Veldhoven (NL); Andrei Mikhailovich Yakunin, Eindhoven (NL); Luigi Scaccabarozzi, Valkenswaard (NL)

(73) Assignee: ASML NETHERLANDS B.V., Veldhoven (NL)

(*) Notice: Subject to any disclaimer, the term of this patent is extended or adjusted under 35 U.S.C. 154(b) by 304 days.

(21) Appl. No.: 13/046,303

(22) Filed: Mar. 11, 2011

(65) Prior Publication Data

US 2011/0222040 A1    Sep. 15, 2011

(51) Int. Cl.
*G03B 27/42*  (2006.01)
*G03F 7/20*  (2006.01)
*H05G 2/00*  (2006.01)

(52) U.S. Cl.
CPC ............ *G03F 7/70916* (2013.01); *H05G 2/003* (2013.01)

(58) Field of Classification Search
CPC ............ G03F 7/70916; G03F 7/70033; G03F 7/70925; G03F 7/70908; G03F 7/70008
USPC .......... 355/30, 53, 67, 71; 378/156, 158, 147, 378/148, 149, 85, 119; 250/492.1, 504, 250/492.2, 504 R, 493.1; 318/119
See application file for complete search history.

(56) References Cited

U.S. PATENT DOCUMENTS 6,359,969 B1   3/2002  Shmaenok
6,614,505 B2   9/2003  Koster et al.
(Continued)

FOREIGN PATENT DOCUMENTS

JP         8-17371      1/1996
JP       2000-252096    9/2000
(Continued)

OTHER PUBLICATIONS

Japanese Office Action mailed Sep. 22, 2014 in corresponding Japanese Patent Application No. 2011-047531.
(Continued)

*Primary Examiner* — Mesfin T Asfaw
(74) *Attorney, Agent, or Firm* — Pillsbury Winthrop Shaw Pittman LLP (57) ABSTRACT

A contaminant trap is used in an EUV radiation source apparatus. An EUV radiation beam is generated and focused through a low pressure gaseous atmosphere into a virtual source point. The EUV radiation creates a plasma in the low pressure hydrogen atmosphere through which it passes. A contaminant trap including electrodes is located in or around radiation beam as it approaches the virtual source point. A DC biasing source is connected to the electrodes to create an electric field oriented to deflect out of the beam path contaminant particles that have been negatively charged by the plasma. Additional RF electrodes and/or an ionizer enhance the plasma to increase the charging of the particles. The deflecting electrodes can be operated with RF bias for a short time, to ensure dissipation of the enhanced plasma.

19 Claims, 5 Drawing Sheets

(56) References Cited

U.S. PATENT DOCUMENTS

| | | | |
|---|---|---|---|
| 6,781,673 B2 | 8/2004 | Moors et al. | |
| 7,230,258 B2 | 6/2007 | Ruzic et al. | |
| 2004/0179182 A1* | 9/2004 | Bakker | 355/69 |
| 2005/0016679 A1 | 1/2005 | Ruzic et al. | |
| 2007/0001126 A1 | 1/2007 | Gayazov et al. | |
| 2008/0083887 A1 | 4/2008 | Komori et al. | |
| 2009/0154642 A1* | 6/2009 | Bykanov et al. | 378/34 |
| 2010/0025231 A1* | 2/2010 | Moriya et al. | 204/192.32 |
| 2010/0243922 A1* | 9/2010 | Asayama et al. | 250/504 R |

FOREIGN PATENT DOCUMENTS

| | | |
|---|---|---|
| JP | 2001-42098 | 2/2001 |
| JP | 2005-197456 | 7/2005 |
| JP | 2006-80255 | 3/2006 |
| JP | 2006-186373 | 7/2006 |
| JP | 2008-277522 | 11/2008 |
| JP | 2009-32791 | 2/2009 |
| JP | 2009-124182 | 6/2009 |
| JP | 2010-519783 | 6/2010 |
| JP | 2010-212674 | 9/2010 |
| WO | WO 2009/032055 | 3/2009 |
| WO | WO 2009/129960 | 10/2009 |

OTHER PUBLICATIONS

U.S. Office Action dated Dec. 11, 2014 in corresponding U.S. Appl. No. 13/580,364.

* cited by examiner

RADIATION SOURCE APPARATUS, LITHOGRAPHIC APPARATUS, METHOD OF GENERATING AND DELIVERING RADIATION AND METHOD FOR MANUFACTURING A DEVICE

CROSS-REFERENCE TO RELATED APPLICATIONS

This application claims the benefit of priority from U.S. Provisional Patent Application No. 61/313,507, filed Mar. 12, 2010, and U.S. Provisional Patent Application No. 61/362, 141, filed Jul. 7, 2010, the contents of both applications are incorporated herein by reference in their entireties.

FIELD

The present invention relates to EUV radiation source apparatus, to EUV lithographic apparatus, to methods of generating and delivering EUV radiation and to a method for manufacturing a device using EUV radiation. The invention also relates to methods and arrangements for trapping contaminant particles in an EUV radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

A potential problem in such systems is that particles of the fuel material tend to be ejected along with the radiation, and can travel at high or low velocities through the apparatus. Where these particles contaminate optical surfaces such as the mirror lenses or the patterning device (e.g. reticle), performance of the apparatus is degraded. U.S. Pat. No. 6,781, 673 by ASML proposes electrostatic deflection to protect a patterning device (e.g. reticle), and the same principles can be applied in protecting other components and spaces of the apparatus. U.S. Pat. No. 6,781,673 proposes charging of particle using photoelectric effect of the EUV beam itself, which yields a positive charge on the tin particles.

Depending on the situation, the photoelectric charging may not be enough to deflect all the unwanted particles. A further potential problem may arise in trying to apply this technique in the hydrogen environment mentioned above. Where gas ($H_2$) is present, the EUV radiation pulses may generate a conductive hydrogen plasma. When this $H_2$ plasma (generated by the EUV beam) is present in the region between the capacitor plates, the applied E-field will be screened by plasma, and may not deflect the particles. Additionally, the plasma will gradually apply a negative charge to the particles, thereby erasing the positive charge of the photoelectric effect.

United States Patent Application Publication No. 2007/0001126 describes a 'foil trap' arrangement for preventing contaminant particles from reaching from a source plasma to a collector optical element of an EUV source apparatus. Electrostatic fields are created between adjacent blades of the foil trap, which accelerate dissipation of the plasma, permitting electrostatic deflection of particles to occur. One embodiment of a foil trap in United States Patent Application Publication No. 2007/0001126 is arranged in two stages, spaced along the path of the radiation and contamination. In a first stage, plasma coming from the source is dissipated by an electric field between blades. In a second stage, no electric field is applied, and the particles are slowed and repelled only by a counter-flowing gas. By improving dissipation of the plasma, it is said that the gas flow can be reduced as compared with prior foil traps.

Another prior publication, United States Patent Application Publication No. 2008/0083887 (Komatsu) proposes to use a strong magnetic field to deflect debris particles around a laser-produced plasma EUV source. In order to ionize particles so that the particles will be trapped by the magnetic field, microwave radiation (electromagnetic radiation in the GHz range) is applied, together with a supply of free electrons, to induce electron cyclotron resonance. In view of additional potential problems consequent on the use of microwaves, measures are disclosed for applying the microwave radiation only in pulses, synchronized with the source laser. Assuming also that the magnetic field requires a superconducting electromagnet to generate it, the entire arrangement may become relatively cumbersome and expensive.

SUMMARY

Embodiments of the invention aim to provide alternative contaminant traps suitable for EUV apparatus with a hydrogen or similar atmosphere. Embodiments of the invention aim to provide protection in the vicinity of an intermediate focus (IF or virtual source point) of an EUV radiation source apparatus.

An aspect of the invention provides an EUV radiation source apparatus configured to generate an EUV radiation beam and focus the EUV radiation beam through a low pressure gaseous atmosphere into a virtual source point, the EUV radiation beam in operation creating a plasma in the atmosphere, the apparatus including a contaminant trap including a first electrode and a second electrode located in or around the path of the radiation beam, and a biasing source connected to the first electrode and the second electrode and configured to create an electric field across the path of the radiation beam as the radiation beam path approaches the virtual source point, the electric field being oriented to deflect out of the beam path contaminant particles that have been electrically charged by the plasma.

In an embodiment, the contaminant trap further includes a third electrode and a fourth electrode positioned in advance of the first and second electrodes with respect to the beam path, and a further biasing source for creating an alternating electric field to increase the density and/or duration of the plasma to enhance the electrical charging of the contaminant particles by the plasma. The third and fourth electrodes may each include a mesh or grid extending in a transverse direction, across the beam path.

The contaminant trap may be arranged to operate in cycles, the biasing source being arranged to apply different bias signals at different times within each operating cycle of the contaminant trap. The biasing source may be arranged to apply an AC bias to the electrodes during a minor portion of each operating cycle. Alternatively or additionally, the biasing source may be arranged to apply an AC bias during a first sub-period in each operating cycle and a DC field during a second sub-period. The biasing source is optionally arranged to apply an AC bias with a first AC characteristic during a first sub-period of the operating cycle, an AC bias with a second AC characteristic during a second sub-period, and a DC bias during a third sub-period. The first AC characteristic may have a lower voltage and lower frequency than the second AC characteristic. In an embodiment, the second sub-period is longer in duration than the first sub-period, and the third sub-period is longer than either the first or second sub-period.

In yet a further embodiment, the contaminant trap further includes an ionizer positioned in advance of the first and second electrodes with respect to the beam path. The ionizer may include a laser constructed to provide a laser beam.

The biasing may be arranged to deflect negatively charged contaminant particles out of the beam path (or other protected location).

In certain embodiments, the plasma is enhanced so as to contribute substantially to the charging of the particles, prior to being dissipated to allow deflection of the particles.

The apparatus may be arranged and/or operated in steps separated in time and/or space in order separately (i) to enhance the gas plasma so as to apply a charge to the particles, (ii) to dissipate the gas plasma, and (iii) to deflect the charged particles. The biasing source may for example be controlled so as to create an AC field for a first sub-period in an operating cycle and a DC field in a second sub-period. Operating cycles may be synchronized with pulses of the EUV radiation.

An aspect of the invention further provides a method of generating and delivering an EUV radiation beam for use in an EUV optical apparatus, the method including: generating EUV radiation at a source point within a low pressure gaseous atmosphere and focusing the EUV radiation in a beam towards a virtual source point using an optical collector, the generation of the EUV radiation being accompanied by generation of contaminant particles; applying a negative charge to the particles in the presence of a plasma in the space, the plasma being formed at least partially by action of the EUV radiation on the near-vacuum atmosphere; dissipating the plasma between a first electrode and a second electrode located in or around the path of the radiation beam in a space between the collector and the virtual source point by applying an electric bias; and deflecting the particles between the electrodes by applying an electric bias to the electrodes to generate an electric field to act on the negative charge.

Generating the EUV radiation may include generating a plasma of metallic fuel material, wherein the contaminant particles include particles of the fuel material with diameter greater than 20 nm, and wherein the near-vacuum atmosphere in the space include hydrogen gas. An example of a fuel material is tin.

Applying the negative charge may be performed using the plasma. Applying the negative charge may include increasing a density and/or duration of the plasma beyond what is naturally induced by the EUV radiation. Increasing the density and/or duration of the plasma may includes applying an alternating electric bias between the first and second electrodes at a time in advance of applying the bias in the dissipating the plasma and the deflecting the particles.

At least two of increasing the density and/or duration of the plasma, dissipating the plasma, and deflecting the particles may be separated in time, and performed repeatedly in synchronism with an operating cycle of the EUV radiation source. A time of flight of the particles in the radiation beam may include more than ten operating cycles of the radiation source.

According to yet a further aspect, a method of manufacturing a device, such as a semiconductor device, is provided, wherein a pattern is projected from a patterning device to a device substrate using EUV radiation generated by the above-mentioned method.

An aspect of the invention further provides a lithographic apparatus incorporating one or more such contaminant trapping devices.

An aspect of the invention further provides a method of manufacturing a device, for example a semiconductor device, using the radiation generated by a method as set forth above.

An aspect of the invention further provides a contaminant trap used in an EUV radiation source apparatus. An EUV radiation beam is generated and focused through a low pressure gaseous atmosphere into a virtual source point. The EUV radiation creates a plasma in the low pressure hydrogen atmosphere through which is passes. Contaminant particles of sizes 20-1000 nm accompany the beam. A contaminant trap including electrodes is located in or around radiation beam as it approaches the virtual source point. A DC biasing source is connected to the electrodes to create an electric field oriented to deflect out of the beam path contaminant particles that have been negatively charged by the plasma. Additional RF electrodes and/or an ionizer enhance the plasma to increase the charging of the particles. The deflecting electrodes can be operated with RF bias for a short time, to ensure dissipation of the enhanced plasma. The electrodes can be operated in a cycle of three steps to enhance the plasma without use of separate electrodes, to dissipate the gas plasma and deflect the charged particles.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
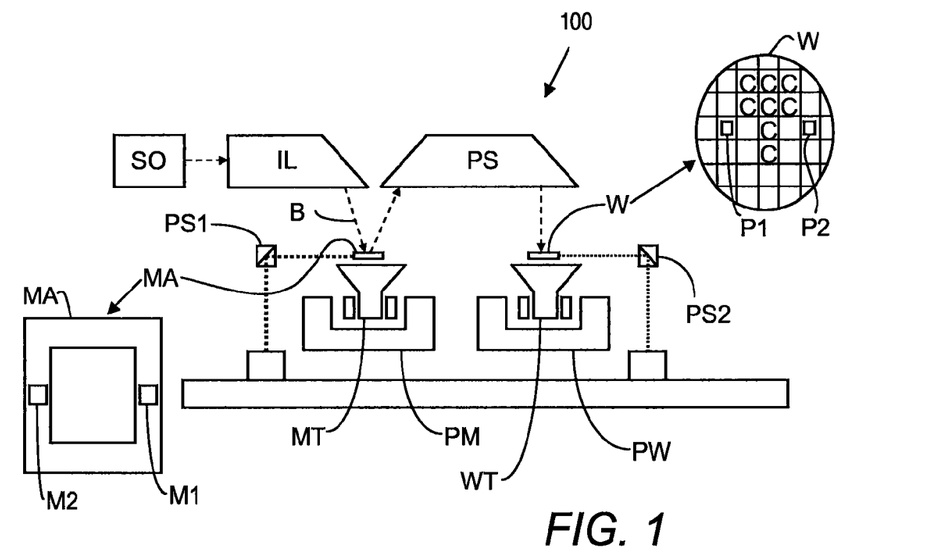
FIG. 1 depicts schematically a lithographic apparatus according to an embodiment of the invention.

FIG. 1 schematically depicts a lithographic apparatus 100 including a source collector module SO according to one embodiment of the invention. The apparatus includes: an illumination system (illuminator) IL configured to condition a radiation beam B (e.g. EUV radiation); a patterning device support or support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support MT holds the patterning device MA in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system including, for example, suitable directing mirrors and/or a beam expander. In other cases the source may be an integral part of the source collector module, for example when the source is a discharge produced plasma EUV generator, often termed as a DPP source.

The illuminator IL may include an adjuster to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:
1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS.
3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
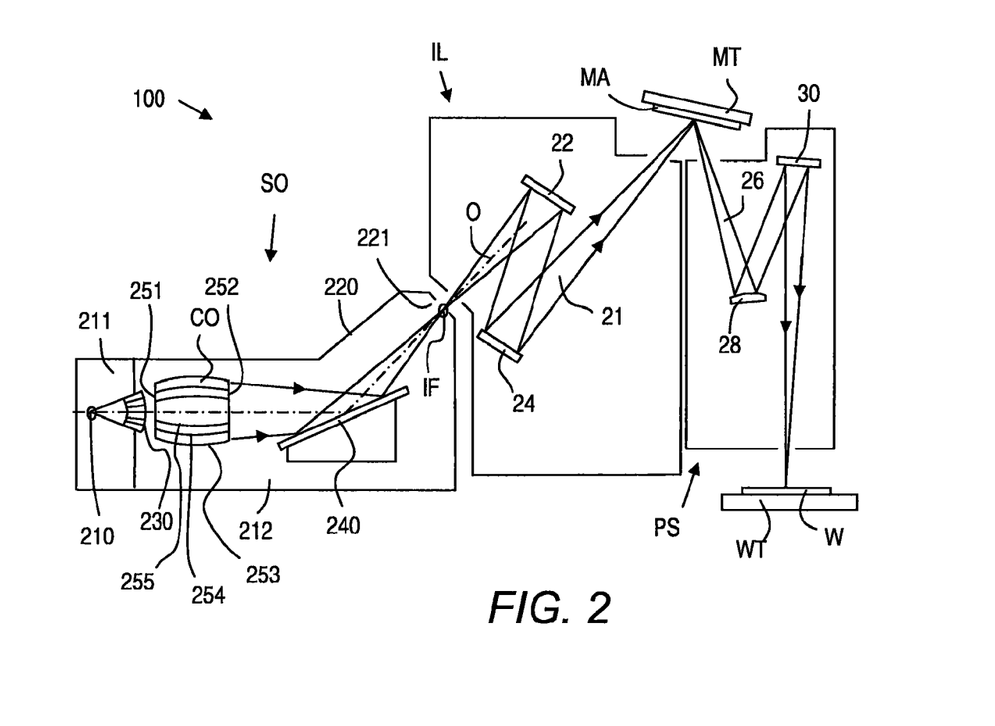
FIG. 2 is a more detailed view of the apparatus of FIG. 1 according to an embodiment of the invention.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. The contaminant trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the patterning device support MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

The radiation collector or collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and the collector optic CO of this type is preferably used in combination with a discharge produced plasma source, often called a DPP source.

Figure 3:
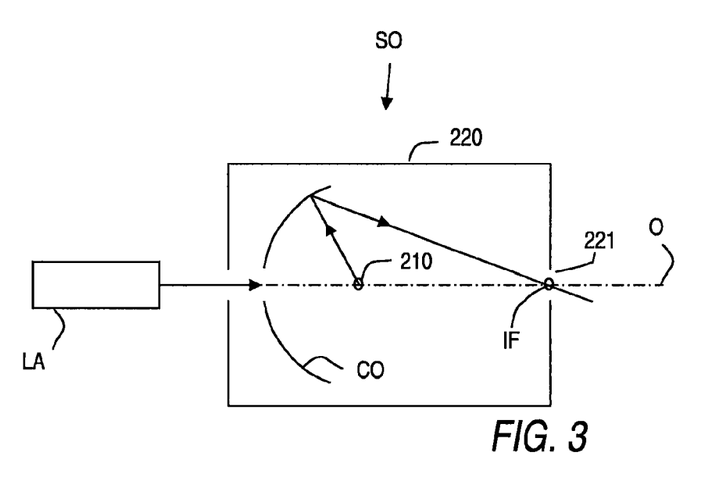
FIG. 3 illustrates an alternative EUV radiation source usable in the apparatus of FIGS. 1 and 2 according to an embodiment of the invention.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
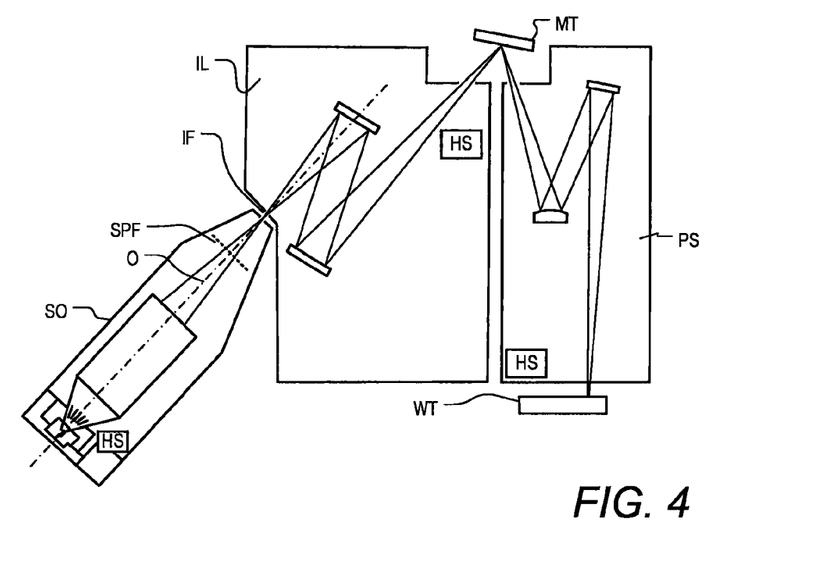
FIG. 4 illustrates a lithographic apparatus in accordance with an embodiment of the invention.

FIG. 4 shows an alternative arrangement for an EUV lithographic apparatus in which the spectral purity filter SPF is of a transmissive type, rather than a reflective grating. The radiation from source collector module SO in this case follows a straight path from the collector to the intermediate focus IF (virtual source point). In alternative embodiments, not shown, the spectral purity filter may be positioned at the virtual source point or at any point between the collector and the virtual source point. The filter can be placed at other locations in the radiation path, for example downstream of the virtual source point. Multiple filters can be deployed. As in the previous examples, the collector CO may be of the grazing incidence type (FIG. 2) or of the direct reflector type (FIG. 3).

As mentioned above, a contaminant trap 230 including a gas barrier is provided in the source compartment. The gas barrier includes a channel structure such as, for instance, described in detail in U.S. Pat. Nos. 6,614,505 and 6,359,969, which are incorporated herein by reference. The purpose of this contaminant trap is to prevent or at least reduce the incidence of fuel material or by-products impinging on the elements of the optical system and degrading their performance over time. The gas barrier may act as a physical barrier (by fluid counter-flow), by chemical interaction with contaminants and/or by electrostatic or electromagnetic deflection of charged particles. In practice, a combination of these methods may be employed to permit transfer of the radiation into the illumination system, while blocking the plasma material to the greatest extent possible. As explained in the mentioned U.S. patents, hydrogen radicals in particular may be injected for chemically modifying the Sn or other plasma materials. Hydrogen radicals can also be applied for cleaning of Sn and other material which may already be deposited on the optical surfaces.

Hydrogen or other gas may be provided as a barrier or buffer against contaminant particles at other points in the lithographic apparatus. In particular, a flow of hydrogen into the near-vacuum environment of source collector module SO can be arranged, to impede particles that may try to pass through the intermediate focus aperture 221 into the projection system. Further, hydrogen gas may be deployed (i) in the vicinity of the patterning device (e.g. reticle) support MT, as a buffer against contaminants from the system contaminating the reticle and (ii) in the vicinity of the wafer support WT, as a buffer against contaminants from the wafer entering the larger vacuum spaces within the system.

For all these purposes, hydrogen sources HS (some shown schematically, some not shown) are deployed for supplying hydrogen gas to each contaminant trap arrangement. Some sources may supply molecular hydrogen gas ($H_2$) as a simple buffer while others generate H radicals. While the hydrogen sources HS are shown only in FIG. 4, they are equally present in the examples of FIGS. 2 and 3. The invention is not limited to embodiments having a hydrogen atmosphere. For example, helium is known as another gas that can be used in a contaminant trap.

Figure 5:
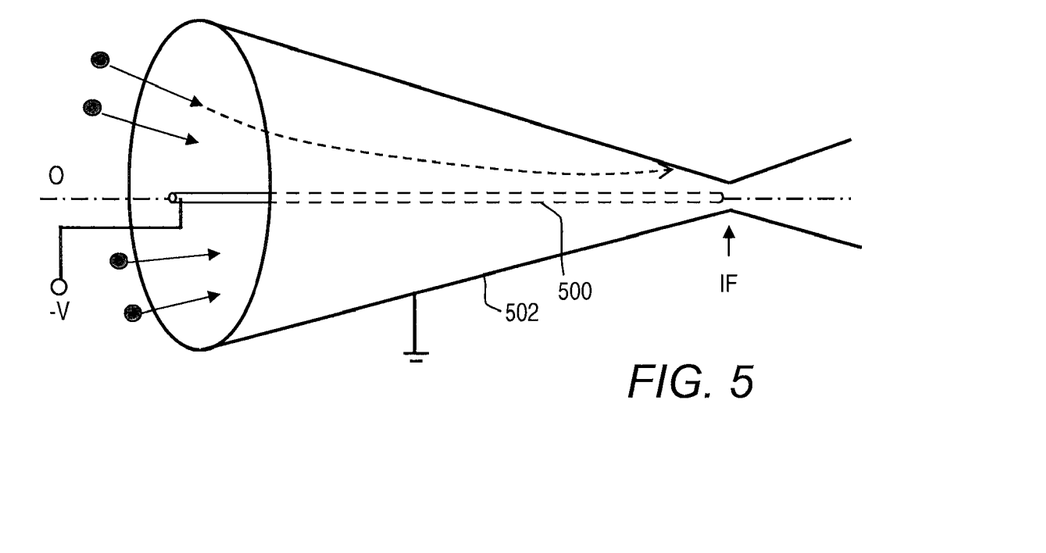
FIG. 5 shows a contaminant trap suitable for use in an embodiment of the invention, the contaminant trap being applied in the region of an aperture in the apparatus of FIGS. 1 to 4.

FIG. 5 illustrates a first example arrangement for protecting the IF aperture, and consequently the illumination system and projection system chambers, against tin particles (generally, particles of the source fuel material) and similar contaminants. In this situation, a pair of electrodes (which can be regarded as capacitor plates) are used to create an electric field which will deviate incoming high-speed particles by electrostatic deflection, such that they would hit one of the electrodes, and not pass into the illumination system IL.

In order for electrostatic deflection to happen, a contaminant particle (black dots in FIG. 5) has to be electrically charged when it is in the space between the electrodes. As mentioned above, however, it is also desirable to eliminate (either completely or at least sufficiently) the plasma formed in the hydrogen or other gaseous atmosphere, which would otherwise shield the desired deflecting effect of the electric field between the electrodes. In some of the arrangements to be described, the hydrogen plasma induced by the EUV radiation is actually used also as the means to charge the particles for deflection. Alternative and/or complementary charging mechanisms can also be exploited.

The geometry of the electrodes will vary according to which parts are being protected. For the example of the IF aperture, FIG. 5 shows a central electrode 500 connected to a negative potential. A grounded, conical wall electrode 502 forms the barrier into which deflected particles will collide, while the wanted EUV radiation continues to the IF. The central electrode 500, which may be a rod or wire much thinner than illustrated, is positioned in the optical axis O of the EUV beam (this is called the obscurated region) and a negative bias is applied (e.g., ~−400 V). Wall electrode 502 need not be exactly conical and may be an existing wall of the apparatus housing, or it may be specially provided and mounted inside the housing (not shown).

The protection process generally works as follows. Because of the $H_2$ environment, a plasma is created over the entire volume crossed by the EUV radiation pulse. The plasma negatively charges any particle (charged, uncharged, conductive or insulating) in the volume, up to the plasma floating potential. The plasma would naturally dissipate over several tens of microseconds (μs). However, EUV pulses in a typical source apparatus have a 50 kHz repetition rate, and hence the plasma is renewed with a period of 20 μs, leading to a semi-continuous plasma. However, when a voltage is applied across the electrodes 500, 502 the field present between the electrodes will dissipate the plasma much faster (~1 μs). The charge remains on the particle, which is then deviated towards (and captured by) the (relatively) positive electrode, which in this case is the wall electrode 502.

Figure 6:
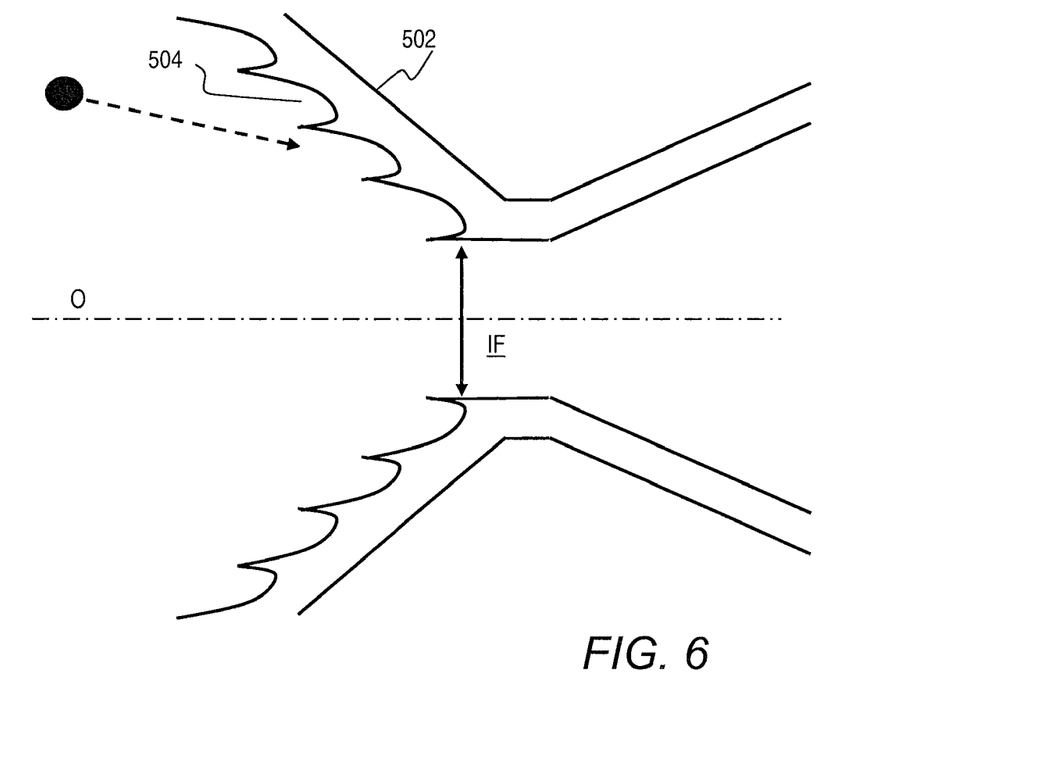
FIG. 6 is a detail of an embodiment of an electrode usable in the contaminant trap of FIG. 5.

In order to minimize the chance that the particle will bounce and still escape through the IF, grooves can be created in the surface of electrode 502 (near IF) so that the particle would get trapped or bounced backwards, in such a way that the $H_2$ counter flow would carry it away from the IF. In an embodiment, these grooves 504 are shown in FIG. 6.

Figure 7:
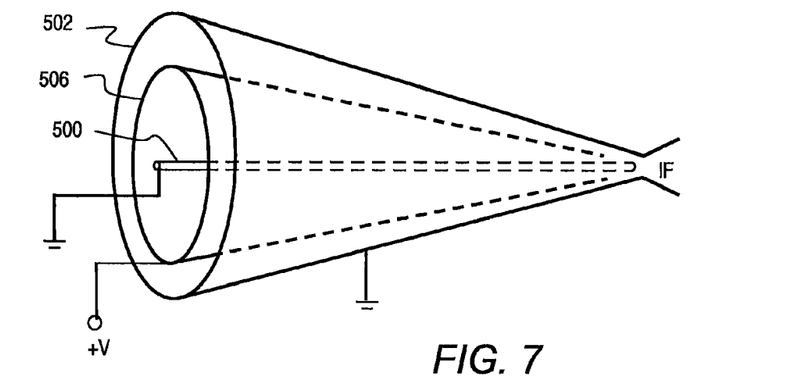
FIG. 7 shows an embodiment of an electrode arrangement suitable for use in embodiments of the invention.

In some cases, it may be that the bias would not be sufficient and/or could not be increased further due to issues such as breakdown or sustained plasma discharge or other electrical conflicts, another embodiment could be used to decrease the bias, as shown in FIG. 7. Here an extra conical electrode 506 is inserted between the central electrode 500 and the outer conical wall electrode 502. The intermediate conical electrode 506 may be biased, while the central electrode 500 and wall electrode 502 are grounded. In this case the (negative)

particles will collide with the intermediate conical electrode 506, rather than with the wall electrode 502.

In this embodiment, the distance between electrodes is effectively halved, doubling the field intensity. Also, the amount of deviation from initial trajectory that is needed to stop a particle is halved. Furthermore, the plasma dissipation time is decreased. In this embodiment, there may be some loss of EUV radiation, due to obscuration by the extra conical electrode 506. Although an intermediate electrode 506 is shown only in FIG. 7, an intermediate electrode can be applied as a modification of any of the embodiments described, including those illustrated in FIGS. 8, 9 and 10. Similarly, multiple intermediate electrodes could be used, so that the bias per electrode can be lowered and efficiency increased, at the potential expense of lower EUV transmission. The polarity of biasing should alternate from each electrode to the next.

Compared with the teaching of U.S. Pat. No. 6,781,673, mentioned above, it will be appreciated that the present examples exploit a negative charging of particles caused by the EUV-induced plasma. A negatively charged electrode is therefore used to repel the particles (or a positively charged electrode may be used to attract them). Further, a voltage is provided on the electrodes that dissipates the plasma. Positive charging by photoelectric effect still occurs, but may be overcome by the stronger negative charging. United States Patent Application Publication No. 2007/0001126 also mentions in the introduction that is relies on electrostatic fields to dissipate plasma between blades of a 'foil trap', placed in the vicinity of the collector CO.

In an embodiment where the EUV pulses come in bursts, contaminant particles produced by the last pulses of the burst will travel in the absence of EUV radiation when they reach the cone and thus may not be charged reliably. In other words, when there is no EUV to generate the plasma, particles will not be charged. Depending on the intensity and frequency of pulses, and the characteristics of the atmosphere, the plasma may be intermittent or weak even while a burst of pulses is being generated. To address this potential problem, and to increase the proportion of contaminant particles that are trapped by the electrostatic deflection, it is proposed to provide active features for this fraction of particles from reaching a certain part of the apparatus. Alternative embodiments are possible in which the potential problem is split in two separate stages: 1) charging and 2) removal. An intermediate stage of dissipating plasma, may be regarded as a separate stage in itself, or as part of one or other of the two stages mentioned already.

Figure 8:
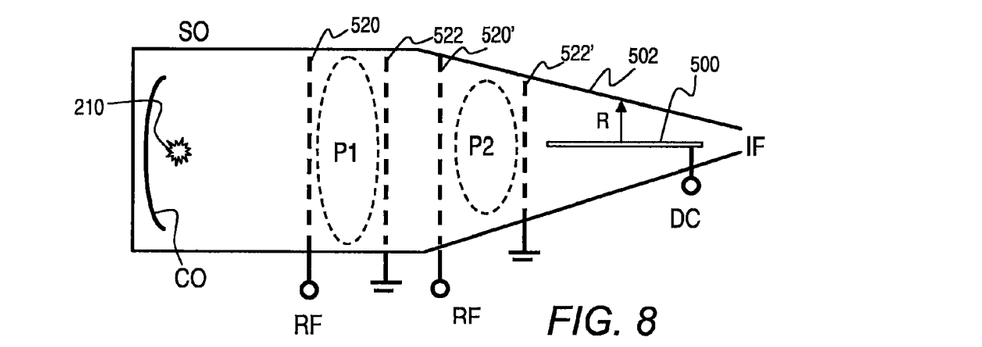
FIG. 8 shows a contaminant trap in accordance with an embodiment of the invention.

FIG. 8 illustrates an embodiment that is constructed as two stages separated along the beam path (which is also the path for contaminant particles). In the first stage, two meshes 520 and 522 are placed in the beam path. One mesh is grounded and an radio frequency (RF) bias is applied to the other mesh. In this configuration, a permanent (steady state) plasma P1, represented by the dotted oval, may be produced, and particles crossing this region may be charged, whether there is EUV radiation present or not. As shown, plasma P1 is formed between meshes 520 & 522 located in a main chamber of the EUV source-collector module. Alternatively, plasma can be generated at position P2, between meshes 520' & 522' located in the beginning of the conical part of the housing, generally referred to as the 'IF cone'.

The second stage is located in the cone and a simple DC is applied to the central electrode 500, as described in the previous examples. The function of the central electrode 500 is firstly to dissipate the EUV-created plasma in the cone and then to electrostatically repel the particles so that they will hit the wall electrode 502 before they cross the IF aperture. This arrangement may therefore be considered as having three stages, two of which are implemented by the same pair of electrodes.

Because the electric field amplitude is inversely proportional to the radial distance from the electrode (R), plasma may be dissipated, quite easily, close to the wire, but not close to the walls. Calculations can be made to see if the approach illustrated will work in a given environment. If desired, one or more intermediate conical electrodes 506 (as shown in FIG. 7) can be used to improve efficacy of the technique.

A potential advantage of this arrangement is that meshes and even the additional conical electrode may only have minimal impact on transmission of the wanted EUV radiation. Permanent plasma may simplify the design of the device, since now charging and removal is decoupled spatially. The decoupling can be done spatially and/or temporally, as will be illustrated further below).

In operation, the particle is directed toward the IF aperture. The EUV beam may charge the particle positively to some extent by photoelectric effect and also create an $H_2$ plasma by photoionization. The plasma electrons in turn charge the particle negatively. An electric field arranged between the electrodes dissipates the plasma. From that point, the field acts on the charged particle, deviating it from the reticle and making it collide with the plate.

Under some conditions, it is anticipated that a simple DC bias on the electrodes 500, 502 will not be sufficient to both discharge the plasma and deflect the particles sufficiently to stop a desired proportion of the traveling particles. A modification now described is to apply a multi-stage biasing. This may be regarded as a two- or three-stage arrangement of the type described above, modified so that two or more of the stages are separated in time, rather than in space.

Figure 9:
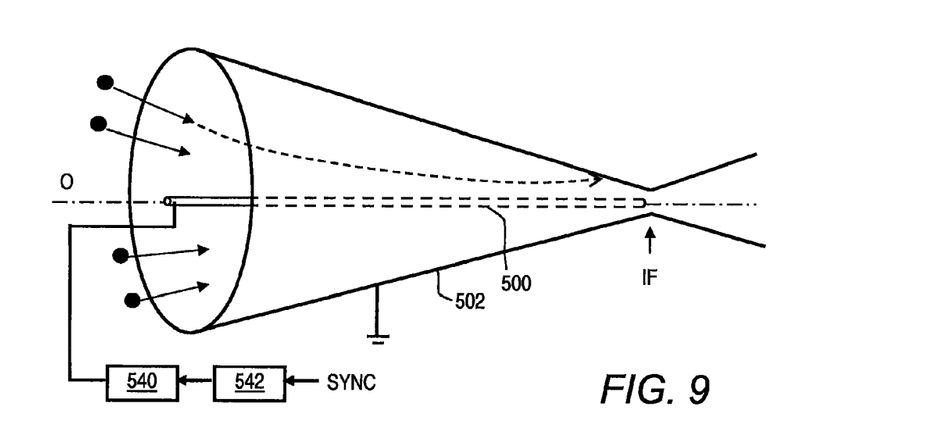
FIG. 9 shows a contaminant trap in accordance with an embodiment of the invention.

FIG. 9 illustrates another embodiment, generally based on the embodiment of FIG. 5, in which a signal generator 540 is put in place of the simple DC supply to bias the electrode 500. Signal generator 540 is controlled by a sequencer 542, which may for example comprise a microcontroller or dedicated logic circuit, to generate a complex sequence of different bias signals, synchronized with reference to a timing signal SYNC, derived from the laser source itself. Using the signal generator, the sequencer 542 in this example implements a 3-stage biasing scheme, synchronized with the EUV pulses of the radiation source. This allows the same electrodes 500, 502 to perform the function of generating additional plasma without the use of separate meshes 520, 522. The measures described here with reference to FIG. 9 can however be used in combination with the measures of FIGS. 8 and/or 10, if desired.

Consider, for the sake of example, an EUV radiation source apparatus in which the total EUV pulse period is around 20 μs (50 kHz repetition rate) and the EUV radiation pulse is intense for about 1 μs at the start of each period. For the sake of this example, furthermore, the contaminant particles in question may be tin particles of size in the range of 20 nm to 1000 nm. Particles in the range of 150 nm to 300 nm and speed in the range of 400 ms$^{-1}$ to 500 ms$^{-1}$, for example, are difficult to trap by the known techniques. Where some prior apparatus may be designed to deflect and trap individual ions of contaminant, the larger particles in this example contain many atoms. Accordingly, the ratio of electric charge to mass will be smaller than for individual ions, and the difficulty of deflecting the particles will be proportionally greater. At the speeds mentioned, particles may travel 0.5 mm in 1 μs, or 10 mm in 20 μs. The distance from collector CO to aperture IF may be a few tens of centimeters.

In this embodiment, the sequencer 542 may programmed to implement the following scheme in a 22 µs cycle:
Step 1: bias RF@100 MHz, 40 V, for 2 µs
Step 2: bias RF@0.25 MHz, 400 V, for 6 µs
Step 3: bias DC@400 V, for 14 µs The function may be as follows. In Step 1, synchronized with the start of the EUV radiation pulse, a bias signal having high RF frequency at modest voltage is used to increase the plasma density. Though some plasma is naturally present, this increased and constant plasma charges the particles much more efficiently. Because now there is a higher plasma density, in Step 2 an AC field, specifically a low-frequency, higher voltage RF bias signal is used to dissipate the plasma more efficiently than the DC bias previously described. After the plasma has been cleared, Step 3 is to apply a high DC voltage to deflect and stop the charged particles. Notice that the particle charge is built up little by little at every pulse, so the slower the particle or the longer the plates, the better the stopping efficiency.

Simulations in this case show almost ~100% stopping efficiency for all particle sizes (20 nm to 1000 nm) can be reached in a similar protection setup, applied to protecting a reticle. In those simulations, each particle is exposed to around 150 pulses. The parameters of electrode geometry, duration of each step, frequency, and voltage can be tailored to optimize performance in a given situation. As well as stopping a certain proportion of particles, it may be desirable to stop especially particles in a certain size range, and parameters of the trapping device may be adapted accordingly.

While the sequence of Steps 1 to 3 is conveniently implemented in a time sequence using a single set of electrodes, there may be instances in which it is desirable to separate the steps spatially. For instance, the conical electrodes could be separated into different segments along the beam path, one segment having AC bias to dissipate plasma and a next segment having DC bias to deflect particles out of the beam path. The different biases could be permanently applied, or they may still in some way be synchronized to the operation of the source.

In addition to a sequence of operations being timed with reference to each individual radiation pulse, signal generation may also or alternatively be controlled to vary in a special way at the beginning or end of a burst of pulse cycles, referred to as the operating period in the introduction and claims.

Figure 10:
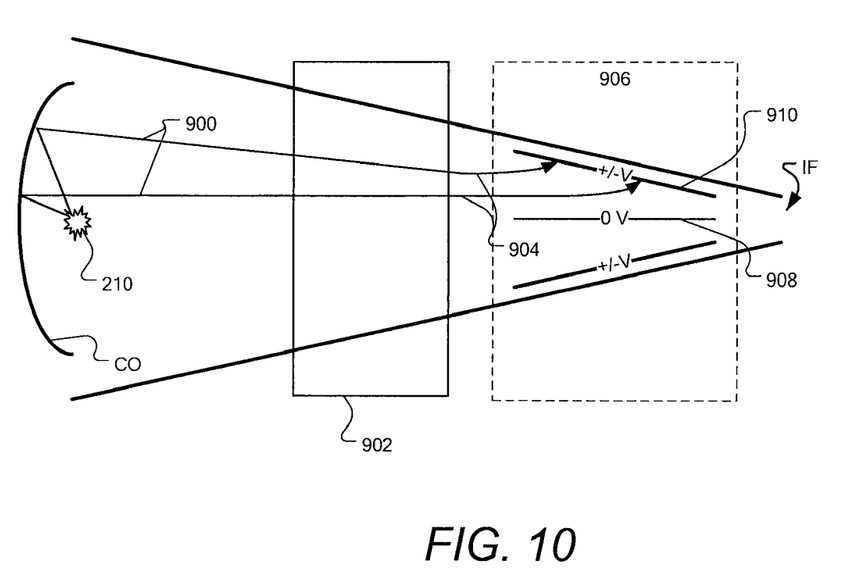
FIG. 10 shows a contaminant trap in accordance with an embodiment of the invention.

Other measures to charge the particles of contaminant are possible, besides generating increased plasma. In FIG. 10, the particles 900 that move toward the IF may be ionized by an ionizer 902 (for example by HV breakdown, but potentially in other ways). The generated ions 904 of tin or other contaminants are then deflected by an electric field towards a trapping unit 906. A unit 906 may comprise electrodes 908 and 910, similar in function to electrodes 500, 502, as described above. The polarity of bias voltages applied to these electrodes will depend on the polarity of the ions which it is desired to stop. The amount of plasma to be dissipated by the electrodes may be less in this example, aiding the electrostatic deflection process.

Figure 11:
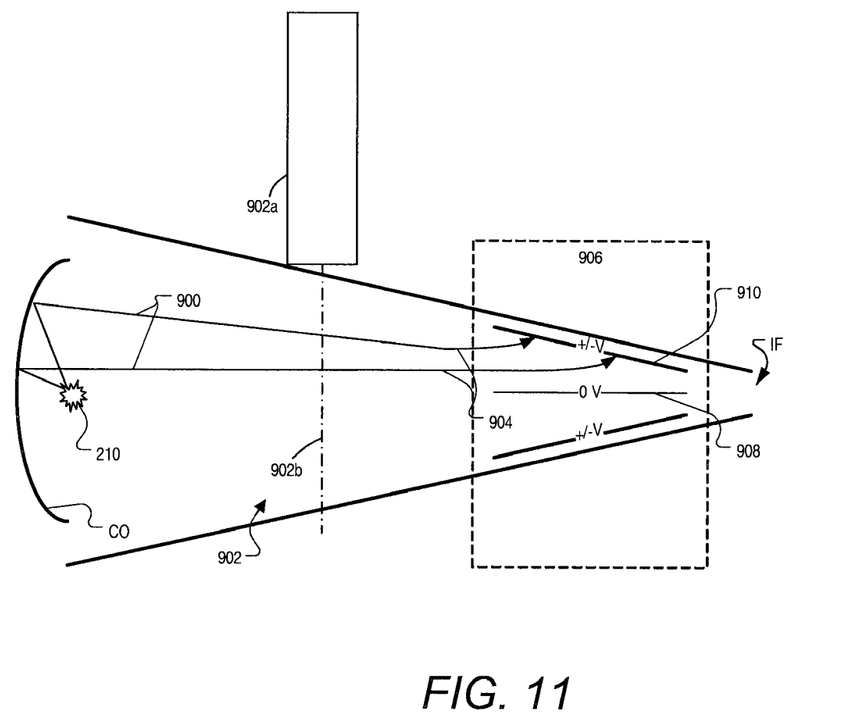
FIG. 11 shows a contaminant trap in accordance with an embodiment of the invention.

In FIG. 11, it is shown that the ionizer 902 may include a laser 902a constructed to provide a laser beam 902b in order to realize cationization by non-resonant multiphoton ionization or resonance enhanced multi-photon ionization through a three step ionization process which is highly efficient. For instance, for macroscopic tin particles, i.e. droplets, a photo-ionization with a wavelength equal to or below 280 nm is sufficient to reach ionization.

With regard to geometry, the conical geometry depicted is suited to the vicinity of the IF aperture where the EUV radiation is focused to a spot. In the vicinity of the reticle in a typical scanning-type lithographic apparatus, the radiation beam is focused to a line or rectangular slit shape, downstream of the illumination system. Protection of the reticle is the subject of co-pending U.S. Provisional Patent Application No. 61/348,521. The electrodes in that situation will more likely have the form of two plates converging, like sides of a wedge, toward the slit. The electrodes such as central electrode 500 and 908 need not be solid, but could be grids of wires or rods. In that case, the majority of contaminant particles will be trapped on whatever surface lies behind the grid.

The combination of frequencies, voltages and time intervals appropriate to attain the desired function will vary in accordance with parameters of a particular apparatus, such as the particular electrode geometries, gas composition and density. A degree of experimentation should be expected, to arrive at the optimum DC voltage and/or sequence. The term RF or radio frequency as used herein can be interpreted widely. RF frequencies greater than 1 MHz, for example in the range 50-800 MHz can be envisaged. Similarly, a wide range of voltage levels may be appropriate to achieve a certain field strength in different geometrical arrangements, and in different plasma densities. As illustrated above, different frequencies may be applied for plasma generation (for example in the range 50-500 MHz), for plasma dissipation (for example in the range 100-1000 MHz) and for electrostatic deflection (for example DC (0 Hz)).

Voltages in the range 10-1000 V may be envisaged, particularly in the range 100-1000 V. Different voltages may be applied for plasma generation (for example in the range 10-200 V), for plasma dissipation (for example in the range 100-1000 V) and for electrostatic deflection (for example in the range 100-1000 V). Different voltages may be applied at different stages of the apparatus separated spatially, as well as in different stages of operation separated in time.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

The present application is concerned particularly with techniques for preventing particles of the radiation source fuel progressing from the source compartment SO into the illumination system and projection system compartments of the apparatus. This will reduce degradation of optical components in the system, including the mirrors 22 etc and the reticle MA. Because EUV reticles need to be operated without a pellicle, they are likely to be subjected to organic and inorganic particle contaminations. Particles as small as ~20 nm deposited on the reticle might cause a fatal defect in every die on the wafer. On the mirror surfaces, the results of contamination may be less catastrophic, but the performance of the mirrors will degrade over time if the contamination is permitted to occur.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. An EUV radiation source apparatus configured to generate an EUV radiation beam and focus the EUV radiation beam through a low pressure gaseous atmosphere into a virtual source point, the EUV radiation beam in operation creating a plasma in the atmosphere, the apparatus comprising:
    a contaminant trap including a first electrode and a second electrode, the first electrode located around the path of the radiation beam, and the second electrode positioned substantially in an obscurated region at an optical axis of the radiation beam; and
    a biasing source connected to the first electrode and the second electrode and configured to create an electric field across the path of the radiation beam as the radiation beam approaches the virtual source point, the electric field being oriented to deflect contaminant particles that have been electrically charged by the plasma out of the beam path.

2. An apparatus as claimed in claim 1, wherein the contaminant trap further comprises a third electrode and a fourth electrode positioned in advance of the first and second electrodes with respect to the beam path, and a further biasing source configured to create an alternating electric field to increase the density and/or duration of the plasma to enhance the electrical charging of the contaminant particles by the plasma.

3. An apparatus as claimed in claim 1, wherein the contaminant trap is arranged to operate in cycles, the biasing source being arranged to apply different bias signals at different times within each operating cycle of the contaminant trap.

4. An apparatus as claimed in claim 3, wherein the contaminant trap is arranged to synchronize the operating cycles of the contaminant trap with operating cycles of the radiation source apparatus, in which EUV radiation is generated in one or more pulses per operating cycle.

5. An apparatus as claimed in claim 3, wherein the biasing source is arranged to apply a DC bias to the first and second electrodes for at least a majority of each operating cycle.

6. An apparatus as claimed in claim 1, wherein the contaminant trap further comprises an ionizer positioned in advance of the first and second electrodes with respect to the beam path.

7. An apparatus as claimed in claim 1, wherein the first electrode comprises grooves constructed and arranged to trap and/or deflect the contaminant particles away from the intermediate focus.

8. An apparatus as claimed in claim 1, wherein the first electrode is a conical wall electrode.

9. An apparatus as claimed in claim 1, wherein the second electrode is a rod or a wire.

10. A lithographic projection apparatus arranged to project a pattern from a patterning device onto a substrate, the projection apparatus being arranged to project the pattern using a beam of extreme ultraviolet (EUV) radiation received from a radiation source apparatus, the radiation source apparatus comprising an EUV source and an optical collector constructed and arranged to focus radiation from the source into a virtual source point for delivery into an optical system of the projection apparatus, and wherein the radiation source apparatus comprises a contaminant trap including a first electrode and a second electrode, the first electrode located around the path of the radiation beam and the second electrode positioned substantially in an obscurated region at an optical axis of the radiation beam and a biasing source connected to the first electrode and the second electrode and configured to create an electric field across the path of the radiation beam as the radiation beam approaches the virtual source point, the electric field being oriented to deflect contaminant particles that have been electrically charged by the plasma out of the beam path, wherein the contaminant trap is positioned between the collector and the virtual source point.

11. A method of generating and delivering an EUV radiation beam for use in an EUV optical apparatus, the method including:
    generating EUV radiation at a source point within a low pressure gaseous atmosphere and focusing the EUV radiation in a beam towards a virtual source point using an optical collector, the generation of the EUV radiation being accompanied by generation of contaminant particles;
    applying a negative charge to the particles in the presence of a plasma in the space, the plasma being formed at least partially by action of the EUV radiation on the near-vacuum atmosphere;
    dissipating the plasma between a first electrode located around the path of the radiation beam and a second electrode positioned substantially in an obscurated region at an optical axis of the radiation beam in a space between the collector and the virtual source point by applying an electric bias; and
    deflecting the particles between the electrodes by applying an electric bias to the electrodes to generate an electric field to act on the negative charge.

12. A method as claimed in claim 11, wherein the applying the negative charge is performed using the plasma.

13. A method as claimed in claim 12, wherein the applying the negative charge comprises increasing a density and/or duration of the plasma beyond what is naturally induced by the EUV radiation.

14. A method as claimed in claim 13, wherein the increasing the density and/or duration of the plasma includes applying an alternating electric bias between third and fourth electrodes positioned in a path of the beam in advance of the first and second electrodes with respect to the beam path.

15. A method as claimed in claim 13, wherein the increasing the density and/or duration of the plasma includes applying an alternating electric bias between the first and second electrodes at a time in advance of applying the bias in the dissipating the plasma and the deflecting the particles, wherein at least two of the increasing the density and/or duration of the plasma, the dissipating the plasma, and the deflecting the particles are separated in time, and performed repeatedly in synchronism with an operating cycle of the EUV radiation source.

16. A method as claimed in claim 15, wherein the increasing the density and/or duration of the plasma is performed at a position separated in space from the position where the dissipating the plasma and the deflecting the particles are performed.

17. A method of manufacturing a device, the method comprising:
    generating EUV radiation at a source point within a low pressure gaseous atmosphere and focusing the EUV radiation in a beam towards a virtual source point using an optical collector, the generation of the EUV radiation being accompanied by generation of contaminant particles;
    applying a negative charge to the particles in the presence of a plasma in the space, the plasma being formed at least partially by action of the EUV radiation on the near-vacuum atmosphere;
    dissipating the plasma between a first electrode located around the path of the radiation beam and a second electrode positioned substantially in an obscurated region at an optical axis of the radiation beam in a space between the collector and the virtual source point by applying an electric bias;
    deflecting the particles between the electrodes by applying an electric bias to the electrodes to generate an electric field to act on the negative charge;
    patterning the EUV radiation with a patterning device; and
    projecting the patterned EUV radiation onto a device substrate.

18. An EUV radiation source apparatus configured to generate an EUV radiation beam and focus the EUV radiation beam through a low pressure gaseous atmosphere into a virtual source point, the EUV radiation beam in operation creating a plasma in the atmosphere, the apparatus comprising:
    a contaminant trap including a first electrode located around the path of the radiation beam and a second electrode positioned substantially in an obscurated region at an optical axis of the radiation beam; and
    a biasing source connected to the first electrode and the second electrode and configured to create an electric field across the path of the radiation beam as the radiation beam approaches the virtual source point, the electric field being oriented to deflect contaminant particles that have been electrically charged by the plasma out of the beam path,
    wherein the apparatus is configured to separately, in time and/or space, (i) enhance the electrical charging of the contaminant particles by the plasma, (ii) dissipate the plasma, and (iii) deflect the electrically charged contaminant particles.

19. A method of generating and delivering an EUV radiation beam for use in an EUV optical apparatus, the method comprising:
    generating EUV radiation at a source point within a low pressure gaseous atmosphere and focusing the EUV radiation in a beam towards a virtual source point using an optical collector, the generation of the EUV radiation being accompanied by generation of contaminant particles;
    applying a negative charge to the particles in the presence of a plasma in the space, the plasma being formed at least partially by action of the EUV radiation on the near-vacuum atmosphere;
    dissipating the plasma between a first electrode located around the path of the radiation beam and a second electrode positioned substantially in an obscurated region at an optical axis of the radiation beam in a space between the collector and the virtual source point by applying an electric bias; and
    deflecting the particles between the electrodes by applying an electric bias to the electrodes to generate an electric field to act on the negative charge,
    wherein applying the negative charge to the particles, dissipating the plasma, and deflecting the particles are performed separately in time and/or space.

* * * * *